(12) United States Patent
Balasuramanian et al.

(10) Patent No.: US 7,042,030 B2
(45) Date of Patent: May 9, 2006

(54) HIGH DENSITY MEMORY ARRAY

(75) Inventors: Suresh Balasuramanian, Coimbatore (IN); Stephen Wayne Spriggs, Rowlett, TX (US); George Jamison, Murphy, TX (US); Mohan Mishra, Madhubani (IN)

(73) Assignee: Texas Instruments Incorporated, Dallas, TX (US)

( * ) Notice: Subject to any disclaimer, the term of this patent is extended or adjusted under 35 U.S.C. 154(b) by 143 days.

(21) Appl. No.: 10/717,551

(22) Filed: Nov. 21, 2003

(65) Prior Publication Data

US 2005/0111250 A1    May 26, 2005

(51) Int. Cl.
*H01L 27/10*    (2006.01)
(52) U.S. Cl. ........................... 257/211; 257/208
(58) Field of Classification Search ............... 257/208, 257/211; 438/128, 129
See application file for complete search history.

(56) References Cited

U.S. PATENT DOCUMENTS

| | | | | |
|---|---|---|---|---|
| 4,827,449 A | * | 5/1989 | Inoue | 365/63 |
| 5,361,223 A | * | 11/1994 | Inoue et al. | 365/51 |
| 5,698,872 A | * | 12/1997 | Takase et al. | 257/206 |
| 5,740,099 A | * | 4/1998 | Tanigawa | 365/51 |
| 5,875,148 A | * | 2/1999 | Tanaka et al. | 365/230.06 |
| 5,877,537 A | * | 3/1999 | Aoki | 257/390 |
| 6,229,169 B1 | * | 5/2001 | Hofmann et al. | 257/296 |
| 6,442,078 B1 | * | 8/2002 | Arimoto | 365/189.08 |
| 6,563,727 B1 | * | 5/2003 | Roth et al. | 365/49 |
| 6,707,085 B1 | * | 3/2004 | Jang et al. | 257/295 |
| 6,849,905 B1 | * | 2/2005 | Ilkbahar et al. | 257/390 |
| 6,891,262 B1 | * | 5/2005 | Nomoto et al. | 257/692 |
| 2004/0125629 A1 | * | 7/2004 | Scheuerlein et al. | 365/17 |

* cited by examiner

*Primary Examiner*—Eugene Lee
(74) *Attorney, Agent, or Firm*—Alan K. Stewart; W. James Brady, III; Frederick J. Telecky, Jr.

(57) ABSTRACT

The memory array contains two layers representing word lines of different rows. Each row contains multiple bit cells sharing the same word line. The two layers are stacked one on top of another to form a high density memory array.

23 Claims, 8 Drawing Sheets

HIGH DENSITY MEMORY ARRAY

BACKGROUND OF THE INVENTION

1. Field of the Invention

The present invention relates to the design of memories, and more specifically to a high density memory array and a method of manufacturing thereof.

2. Related Art

Memory arrays generally refer to structures which store data. A memory array typically contains several bit cells, with each cell storing a bit of data. It is generally desirable that a memory array be implemented with high density. Compact memory arrays generally provide higher access rates and may also consume less electrical power.

BRIEF DESCRIPTION OF THE DRAWINGS

The present invention will be described with reference to the following accompanying drawings described briefly below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE PREFERRED EMBODIMENTS

1. Overview

A memory array provided according to an aspect of the present invention contains two layers representing word lines of different rows (with each row containing multiple bit cells sharing the same word line) to be stacked (i.e., laying one on top of another). Each word line may be implemented in the form of a metal layer. A high density memory array may be attained as a result.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. ROM

Figure 1:
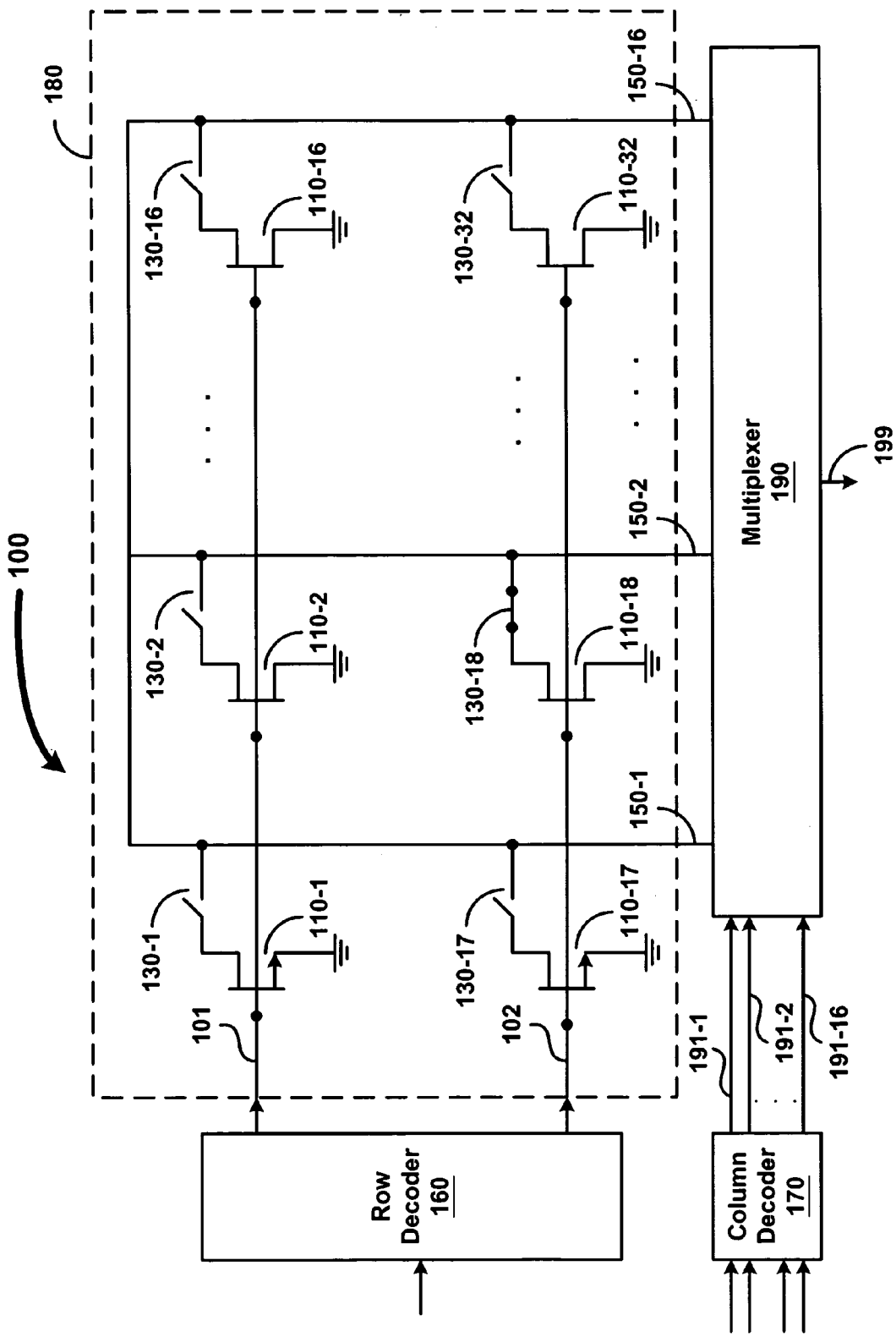
FIG. 1 is a circuit diagram of a ROM illustrating the details of an example embodiment in which various aspects of the present invention are implemented.

FIG. 1 is a circuit diagram illustrating of a memory unit illustrating the details of a memory array in one embodiment. ROM 100 is shown containing row decoder 160, column decoder 170, memory array 180 and multiplexer 190. Merely for conciseness, memory array 180 is shown containing only 32 bit cells organized in the form of 2 rows, with each row containing 16 bit cells. The 32 bit cells are respectively implemented using 32 transistors 110-1 through 110-32. In the description below, the terms bit cell and transistor are used interchangeably.

Row decoder 160 receives 1-bit of a 5-bit address, and enables (sets to 1) one of word lines_101 and 102 depending on the value of the 1-bit. Column decoder 170 receives the remaining 4 bits and enables one of the 16 column select lines 190-1 through 190-16. As described below, the data stored in one of the 32 bit cells (corresponding to the value of the 5 bit address) is provided on path 199.

Each word line is shared by all the bit cells in a row. Thus, word line 101 is shared by (connected to the gate terminal of) transistors 110-1 through 110-16, and word line 102 is shared by transistors 110-17 through 110-32. Similarly, each of bit lines 150-1 through 150-16 is shared by all bit cells in the corresponding column. For example, bit line 150-1 is shared by transistors 110-1 and 110-17 since the corresponding drain terminals are connected to bit line 150-1 via respective switches 130-1 and 130-17.

Each bit cell is programmed to either a 0 or 1 depending on whether the drain terminal is connected (or not) to the corresponding bit line through corresponding one of switches 130-1 through 130-32. Broadly, all the bit lines are first charged to a 1 when all the gate terminals (word lines) are disabled, and selected (by enabling the corresponding gate line) one of the transistors discharges the line only if the corresponding switch is closed (due to the connection of the source terminal to Vss/ground). If the transistor corresponding to the selected (by word line) transistor in the column is open, the bit line remains charged, and thus a 1 would be read from the column.

Thus, transistor 110-1 is programmed to generate a 1 since the corresponding switch 130-1 is open. Transistor 110-17 is programmed to generate a 0 since the corresponding switch 130-18 is closed. The stored bit is provided on the corresponding bit line when the corresponding word line is set to 1.

Multiplexor 190 is coupled to receive the 16 bit lines 150-1 through 150-16, and selects one of the bits (on path 199) corresponding to the enabled one of column select lines 191-1 through 191-16.

In operation, to retrieve a bit, a 5-bit address is generated, with 1-bit being provided as input to row decoder 160, and the remaining 4 bits being provided to column decoder 170. Only one of the word lines (150-1 and 150-2) and one of the column select lines (190-1 through 190-16) is set to 1 ("enabled") as described above.

The bits stored in the rows corresponding to the enabled word line are provided on the corresponding bit lines (due to the turning on of the corresponding transistors only). Multiplexor 190 selects one of the bit lines corresponding to the enabled column select line. Thus, the bit specified by the 5-bit address is received on path 199.

An aspect of the present invention enables memory array 180 to be implemented with a high density by stacking (i.e., laying one on top of another) metal layers representing the word lines (102 and 101 in the above example). The feature may be appreciated better by understanding an example embodiment in which such stacking is not used. Accordingly, such an example embodiment is described below with reference to FIG. 3.

However, to understand the details of the embodiments described below, it is helpful to have a convention to depict various layers. Accordingly an example convention used in the description is described below first with reference to FIG. 2.

3. Convention

Figure 2:
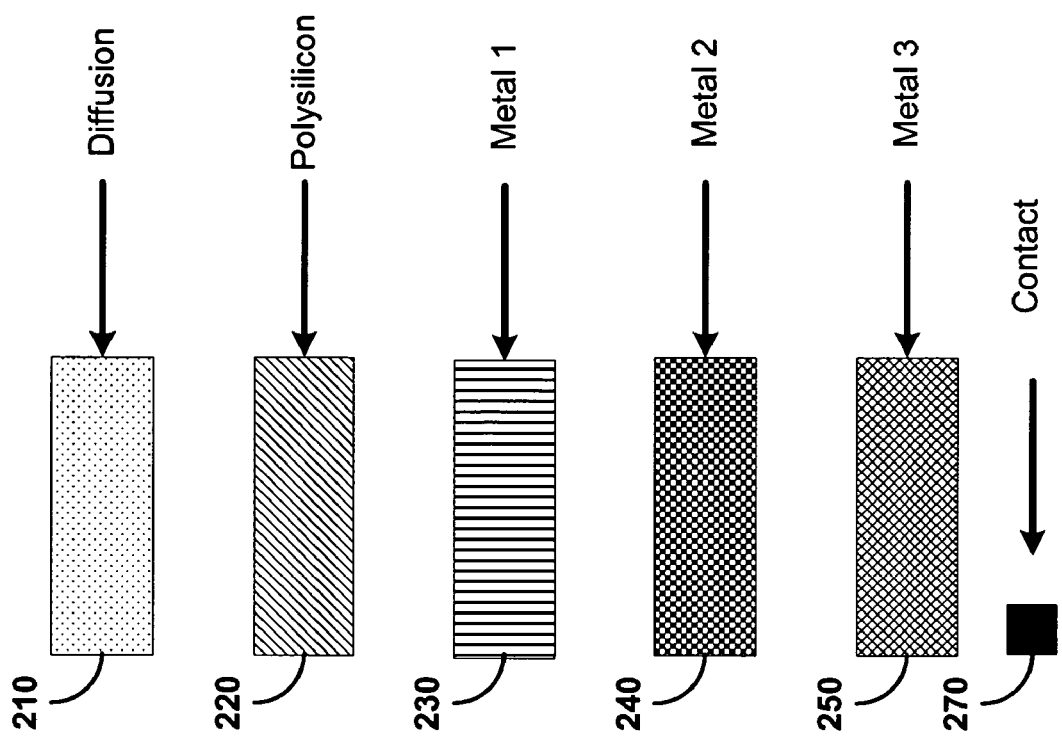
FIG. 2 illustrates the conventions used to represent various layers in the layout structures.

In FIG. 2, the diffusion layer, poly-silicon layer, metal1, metal2, metal 3, and contact are respectively represented by patterns 210, 220, 230, 240, 250 and 270 respectively. This convention is attempted to be used in all the drawings below related to layout structures. The description is continued with reference to an example prior layout structure in which metal layers representing word lines do not overlap.

4. Layout Without Word Lines Stacked

Figure 3:
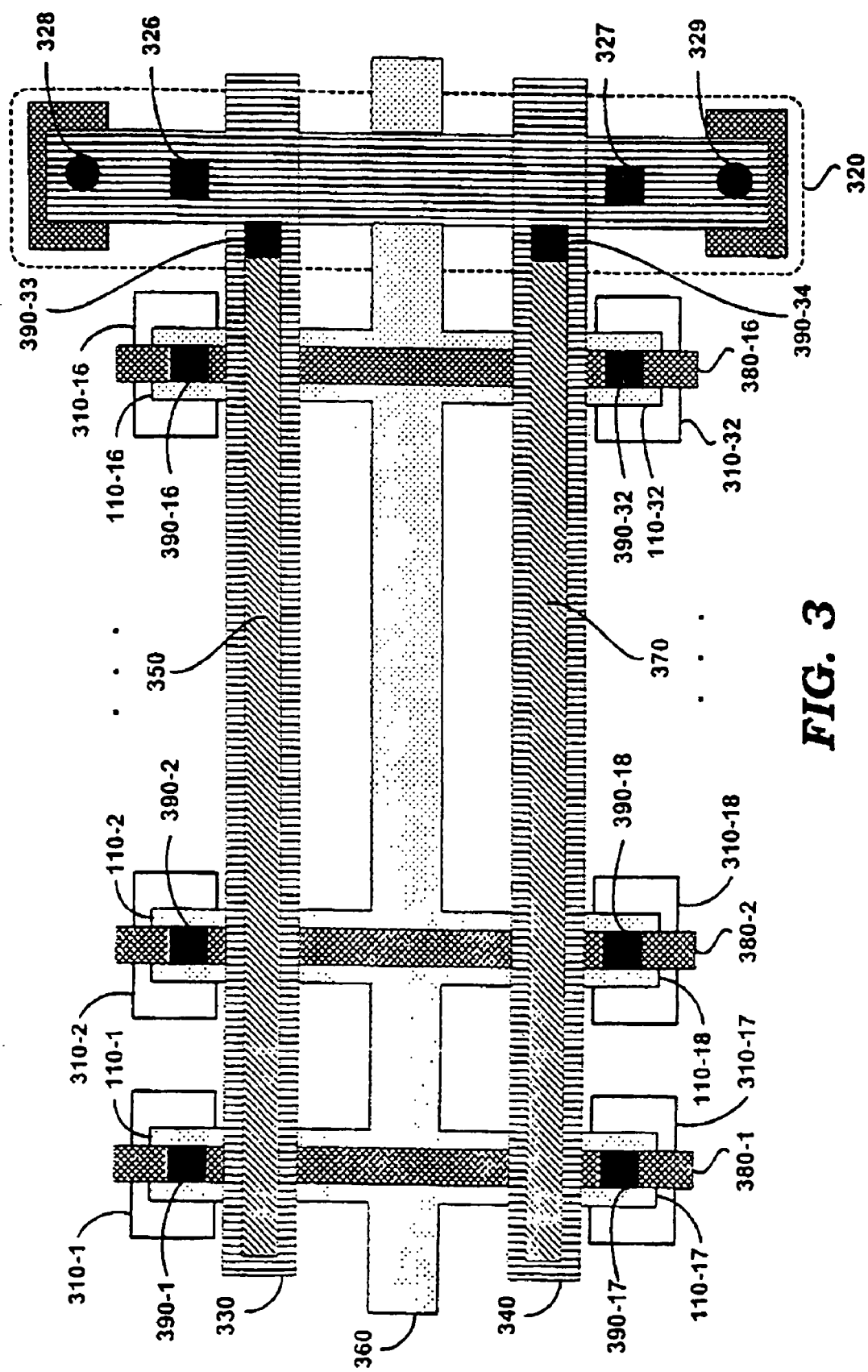
FIG. 3 is a diagram illustrating the details of layout structure of two rows of a memory array in one prior embodiment.

FIG. 3 is a diagram illustrating the details of layout structure of two rows of a memory array in one prior embodiment. The layout structure is shown containing diffusion layer 360, poly-silicon layers 350 and 370, metal1 layers 330 and 340, metal islands 310-1 through 310-32, columns 380-1 through 380-16 (using metal3 layer), power strap 320, contact points 390-1 through 390-34. Merely for illustration, the various layers of FIG. 3 are described in reference to the components depicted in FIG. 1.

Diffusion layer 360 provides the source and drain areas for transistors 110-1 through 110-32. Poly-silicon layer 350 provides the gate area for transistors 110-1 through 110-16, and poly-silicon layer 370 provides the gate area for transistors 110-17 through 110-32.

Metal1 layer 330 is laid parallel to and on top of poly-silicon layer 350. For illustration only, the poly-silicon layer is shown surrounded by the metal1 layer. Similarly, metal1 layer 340 is laid parallel to and on top of poly-silicon layer 370. The two metal layers 330 and 340 represent the corresponding word lines 101 and 102 respectively.

The metal1 layer is used to lay various metal islands 310-1 through 310-32. Each metal island is formed by laying metal2 and metal3 layers (described below) as well. Columns 380-1 through 380-16 represent bit lines 150-1 through 150-16 respectively, and are formed by metal3 layer.

Power strap 320 is used to provide connection to Vss/ground. Power strap 320 may be implemented using all the metal layers, but is shown with metal3 layer on top and bottom where the ground connection is provided. All the metal layers are connected using Via1 and Via2 (not shown) as represented by connection points 328 and 329. The metal1 layer in power strap 320 provides the connection from Vss to the source terminals of transistors 110-1 through 110-32 by using diffusion layer. Such a connection is established by using contacts 326 and 327.

Contact points 390-1 through 390-32 are used to connect drain areas of transistors 110-1 through 110-32 to corresponding portion of metal1 layer in metal islands. Contact point 390-33 is used to connect metal1 layer 330 to poly-silicon layer 350 to connect the word line 101 to gate terminals of each transistor 110-1 through 110-16. Similarly, contact point 390-34 connects word line 102 to the gate terminals of each transistor 110-17 through 110-32. Via1 layer (not shown) may be used to connect metal1 layer to metal2 layer in metal islands.

Then a user may be provided the option of programming each bit cell to either 0 or 1 by appropriate use of Via2 layer. Specifically, Via2 layer may be used to connect metal3 to metal2 to program a value of 0. The laying of Via2 layer completes the connection between the drain area and the bit line/Vdd as the Via1 and contact points are already established.

The manner in which the embodiment of FIG. 3 can be modified to increase the density of memory array 180 is described below.

5. Layout With Stacked Word Lines

Figure 4:
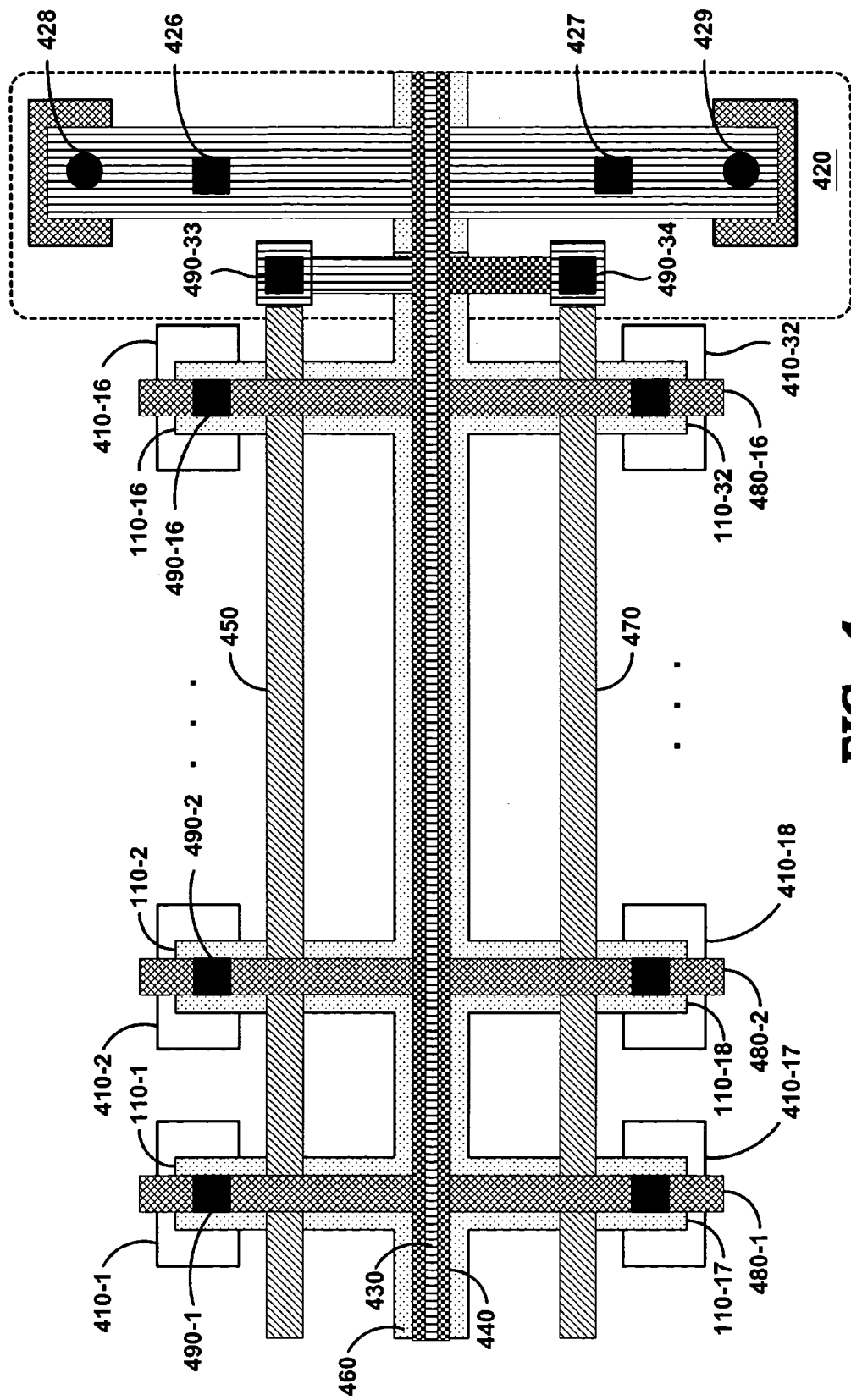
FIG. 4 is a diagram illustrating the details of a layout structure for bit cells in an embodiment of the present invention.

FIG. 4 is a diagram illustrating the details of a layout structure for bit cells in an embodiment of the present invention. The layout structure is shown containing diffusion layer 460, poly-silicon layers 450 and 470, metal 1 layer 430, metal2 layer 440, metal islands 410-1 through 410-32, power strap 420, columns 480-1 through 480-16, and contact points 490-1 through 490-34. Merely for conciseness, the description is provided in comparison to the embodiment of FIG. 3.

Diffusion layer 460, poly-silicon layers 450 and 470, metal islands 410-1 through 410-32, columns 480-1 through 480-16, contact points 490-1 through 490-32, and power strap 420 are respectively described similar to diffusion layer 360, poly-silicon layers 350 and 370, metal islands 310-1 through 310-32, columns 380-1 through 380-16, contact points 390-1 through 390-32, and power strap 320. The remaining components are described below in further detail.

Metal1 layer 430 provides word line 101, and metal2 layer 440 provides word line 102. The two word lines are stacked on each other, that is, metal2 layer is laid on top of metal1 layer as applicable to the word lines. Merely for clarity, metal2 layer 440 is shown surrounding metal1 layer 430. Due to the stacking of the word lines, the density of memory array 180 is enhanced as described below with reference to FIGS. 5A and 5B.

Contact point 490-33 connects word line 101 (metal1) to the gate terminal of each transistor 110-1 through 110-16. Contact point 490-34, in combination with Via1 (not shown) connects word line 102 (metal2) to the gate terminal of each transistor 110-17 through 110-32. As is well known in the relevant arts, Via1 provides the connection between metal1 and metal2 layers. Via2 layer can again be used to program each bit cell to either 0 or 1 as described above.

As noted above, word lines are stacked according to an aspect of the present invention. Such stacking leads to increase in density of memory array 180 as described below with reference to FIGS. 5A and 5B.

6. Increased Memory Density

Figure 5B:
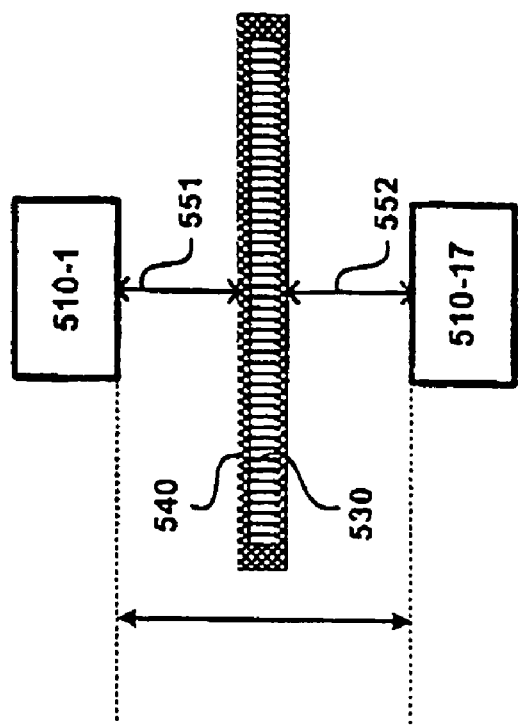
FIGS. 5A and 5B respectively depict portions of memory arrays of FIGS. 3 and 4 as relevant to illustrating qualitatively the reduction in amount of space required in a die according to various aspects of the present invention.
Figure 5A:
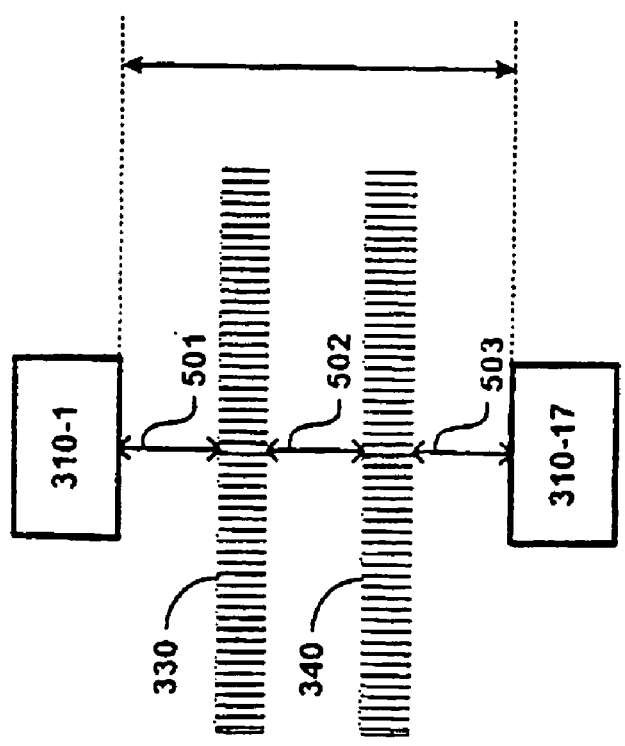

FIGS. 5A and 5B respectively depict portions of memory arrays of FIGS. 3 and 4 relevant to illustrate qualitatively the amount of space required on a die. With respect to FIG. 5A, the electrical properties may require that distance 501 be maintained between metal island 310-1 and word line 101 formed by metal1 layer 330 (due to the use of metal in both), distance 502 be maintained between the two word lines, and distance 503 be maintained between word line 102 formed by metal1 layer 340 and metal island 310-17.

On the other hand, with respect to FIG. 5B, distance 551 may need to be maintained between metal island 410-1 and stacked word lines 101/102 (formed by metal1 layer 430 and metal2 layer 440), and distance 552 be maintained between the stacked word lines and metal island 410-17. As may be appreciated, the sum of distances (501, 502 and 503) is greater than the sum of distances (551 and 552). Thus, the average height of the bit cells in accordance with FIG. 4 is less than the average height of the bit cells in accordance with FIG. 3. As a result, a memory array using stacked word lines may have increased density.

Several other advantages may be attained due to the stacking of the word-lines. For example, the length of the bit lines may be reduced (due to the height reduction resulting from stacking). As a result, the bit lines would have lesser capacitance, which leads to higher access rates and lower power consumption. The access rates may also be enhanced due to the reduction in the shared diffusion area (and consequently the diffusion resistance).

It should be understood that FIG. 4 merely illustrates an embodiment according to the present invention. Various alternative embodiments can be implemented without departing from the scope and spirit of the present invention, as will be apparent to one skilled in the relevant arts by reading the disclosure provided herein. Such alternative embodiments are contemplated to be within the scope and spirit of various aspects of the present invention. The description is continued with reference an example alternative embodiment.

7. Alternative Embodiment

Figure 6:
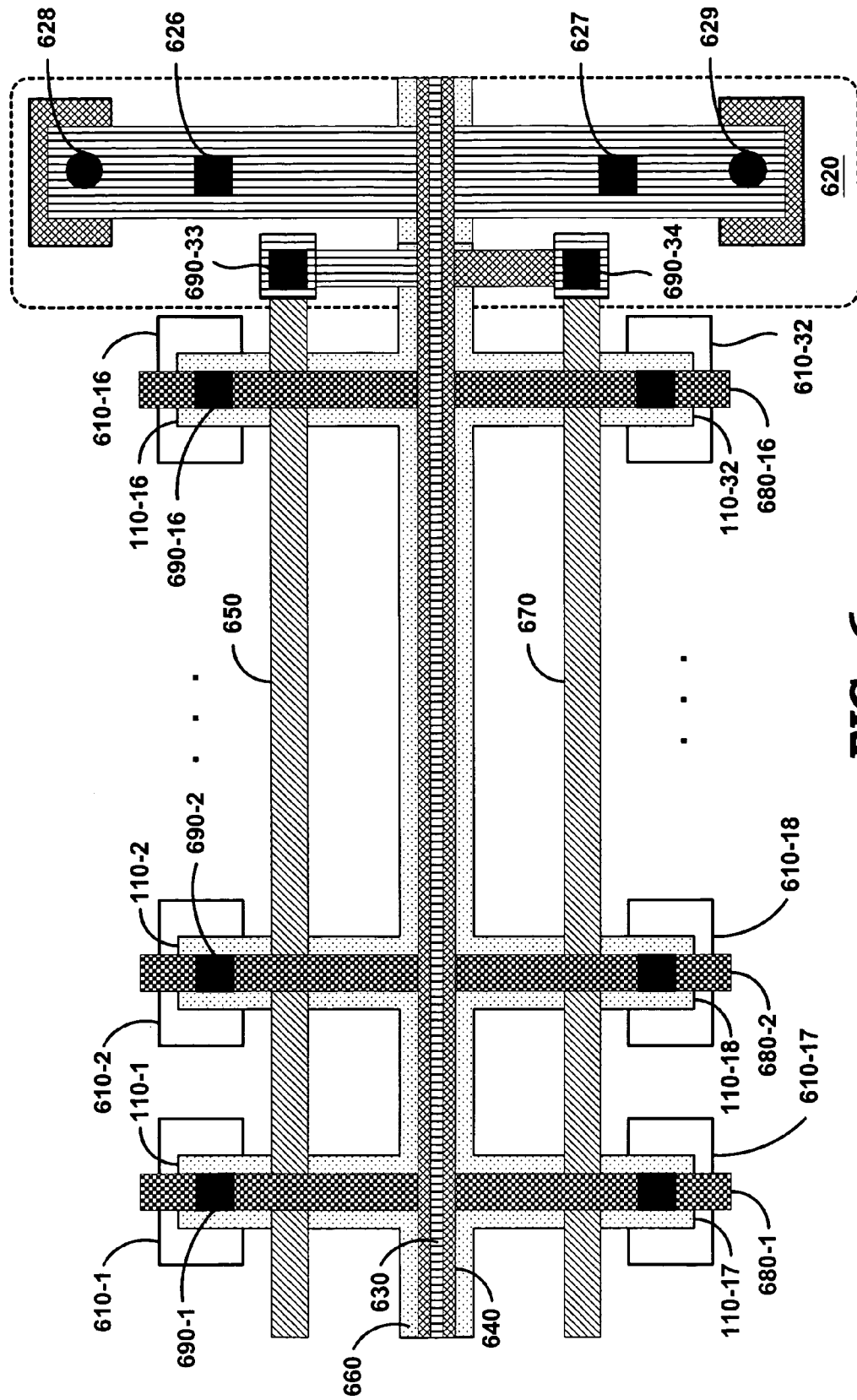
FIG. 6 is a diagram illustrating the details of layout structure of an alternative embodiment of a memory array according to an aspect of the present invention.

FIG. 6 is a diagram illustrating the details of layout structure of an alternative embodiment of a memory array according to an aspect of the present invention. The layout structure is shown containing diffusion layer 660, poly-silicon layers 650 and 670, columns 680-1 through 680-16, metal1 layer 630, metal2 layer 640, metal islands 610-1 through 610-32, power strap 620, contact points 690-1 through 690-34. Merely for conciseness, the description is provided in comparison to the embodiment of FIG. 4.

Diffusion layer 660, poly-silicon layers 650 and 670, power strap 620, metal islands 610-1 through 610-32, contact points 690-1 through 690-33 are respectively described similar to diffusion layer 460, poly-silicon layers 450 and 470, power strap 420, metal islands 410-1 through 410-32, and contact points 490-1 through 490-33. The remaining components are described below in further detail.

The details of FIG. 6 may be understood by first appreciating that the layout structure of FIG. 4 provides for 0 or 1 programming by using Via2 layer. On the other hand, the layout structure of FIG. 6 enables programming by Via1 layer as described below.

Word line 102 is formed using metal3 layer and columns 680-1 through 680-16 are formed using metal 2 layer. As metal2 layer is used to implement the columns representing the bit lines (150-1 through 150-16), Via1 layer may be used to program each bit cell to either 0 or 1. The remaining differences of FIG. 6 compared to FIG. 4 are briefly described below.

Contact 690-34, in combination with Via1 and Via2 (both not shown), connects word line 102 to the gate terminals of each transistor 110-17 through 110-32.

The embodiment of FIG. 6 provides several advantages over the embodiment of FIG. 4. For example, using lower layer (metal2) for forming bit lines shields interference from noise caused due to external circuits. Due to greater distance between the two metal layers (i.e., metal1 and metal3), the parasitic coupling capacitance between word lines is accordingly lower (compared to in the scenario of FIG. 4, in which metal1 and metal2 are used for the word lines). As a result, the access times may be reduced.

The description is continued with reference to the manner in which embodiments according to various aspects of the present invention can be implemented.

8. Method

Figure 7:
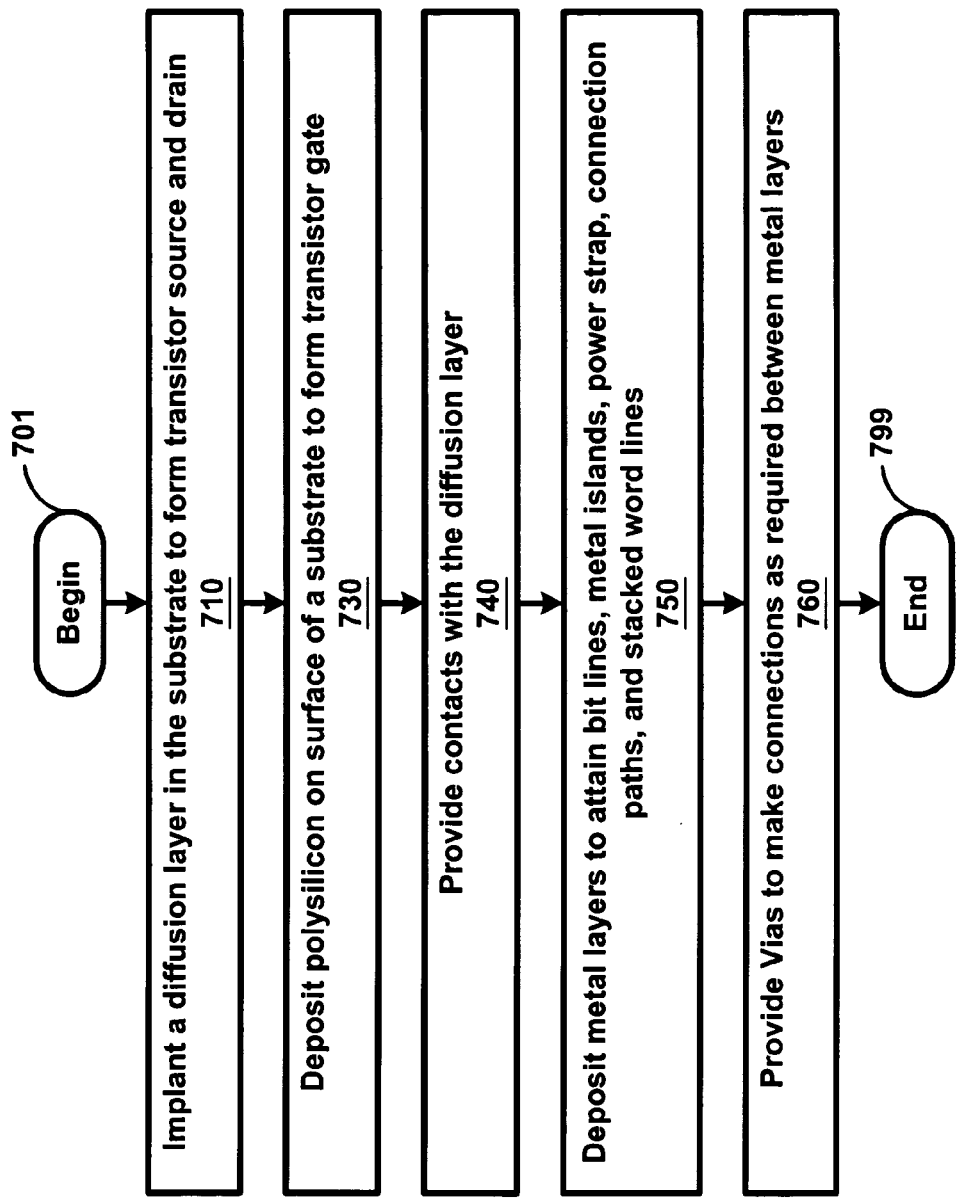
FIG. 7 is a flow chart illustrating the manner in which memory arrays may be manufactured according to an aspect of the present invention.

FIG. 7 is a flow chart illustrating the manner in which memory arrays may be manufactured according to an aspect of the present invention. It should be understood that the steps of FIG. 7 can be implemented using various manufacturing equipment widely available in the industry. In addition, the layout structures described above can be implemented using other approaches as well. The flow chart is described with reference to the embodiments described above merely for illustration. However, the method may be used to implement other memory arrays as well. The method begins in step 701, in which control immediately passes to step 710.

In step 710, a diffusion layer is implanted in the substrate to form transistor source and drain. The diffusion layer is shown as 460 and 660 in FIGS. 4 and 6 respectively. In step 730, poly-silicon is deposited on the article of manufacture produced instep 710. Two poly-silicon layers for the adjacent rows are depicted in each of FIGS. 4 and 6.

In step 740, contacts are provided with the underneath layers. In general, holes are etched (in oxide layer, which is usually present between layers to act as an insulator) and the contact layer (usually a metal) is deposited to provide the contacts. Thus, with respect to FIG. 4, contacts are provided at 491,490-1 through 490-32 with diffusion layer, and 490-33 and 490-34 with poly-silicon layers 450,and 470 respectively. Contacts 436 and 437 are also provided in power strap 420 to make connection with Vdd. Similar contacts are provided in relation to the embodiment of FIG. 6.

In step 750, various metal layers are deposited to attain bit lines, metal islands, power strap, connection paths, and stacked word lines. Thus, with reference to FIG. 4, metal1 layer is used to lay word line 101, and in at least a portion of the area eventually forming metal islands 410-1 through 410-32 and power strap 420. Metal1 layer is used to lay the connection paths from word line 101 to poly-silicon layer 450, and also between word line 102 and poly-silicon layer 470. Metal1 layer is used similarly with reference to FIG. 6 as well.

Continuing with reference to FIG. 4, Metal2 layer is used lay word line 102, at least a portion of the area eventually forming power strap 420 and metal islands 410-1 through 410-32, and connection path from word line 102 to poly-silicon layer 470. With respect to FIG. 6, metal2 layer is used to lay bit lines 680-1 through 680-16, at least a portion of the area eventually forming power strap 620 and metal islands 610-1 through 610-32, and connection path from word line 102 to poly-silicon layer 670.

Referring back to FIG. 4, metal3 layer is used to lay bit lines 480-1 through 480-16, and at least a portion of the area eventually forming power strap 420 and metal islands 410-1 through 410-32. With respect to FIG. 6, metal3 layer is used to lay word line 102, connection path from word line 102 to poly-silicon layer 670, and at least a portion of the area eventually forming power strap 620 and metal islands 610-1 through 610-32.

In step 760, Vias are provided to make connections as required between metal layers. It will be appreciated by one skilled in the relevant arts that portions of steps 760 and 750 will be inter-mixed. For example, Via1 layer is generally laid after metal1 layer, and Via2 layer is laid after metal2 layer.

In particular, with reference to the embodiment of FIG. 4, Via1 layer is laid at points 490-1 to 490-32, 428, 429 and 490-34. Via2 layer is laid at 490-1 to 490-32, 428 and 429. Via3 may be laid at 428 and 429 if Vss is routed using metal4 layer. With respect to the embodiment of FIG. 6, Via1 layer is laid at points 690-1 to 690-32, 628, 629 and 690-34. Via2 layer is laid at 690-1 to 690-32, 690-34, 628 and 629. Via3 may be laid at 628 and 629 if Vss is routed using metal4 layer.

In addition, each bit cell is also programmed to a desired value by appropriate programming. With respect to the embodiment of FIG. 4, a bit is programmed to 0 by laying the Via2 layer at the corresponding one of points 490-1 through 490-32, and is programmed to 1 by just not laying the Via2 at the same point. With respect to the embodiment of FIG. 6, a bit is programmed to 0 by laying Via1 layer at the corresponding one of points 690-1 through 690-32. The method then ends in step 799.

9. Device

Figure 8:
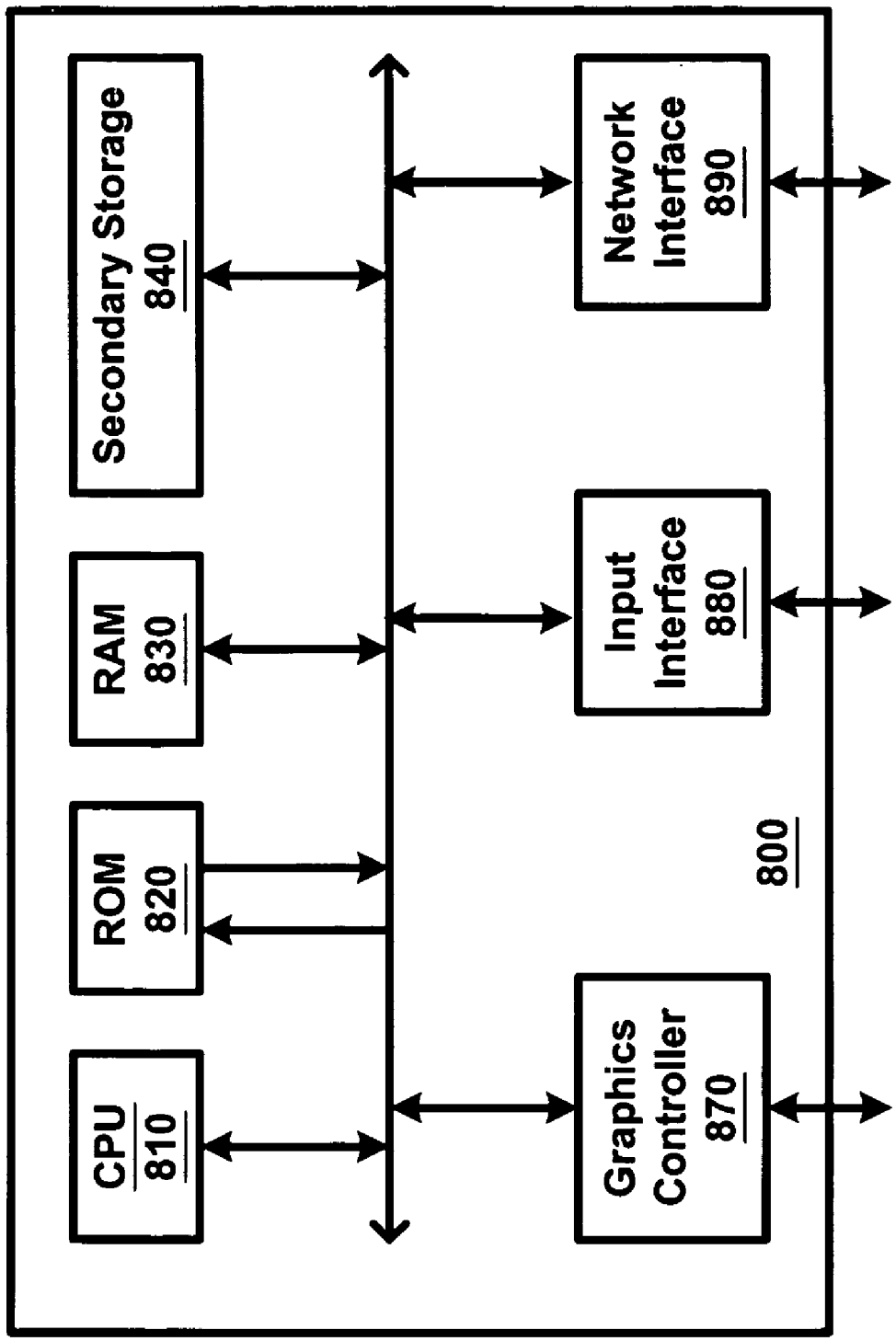
FIG. 8 is a block diagram illustrating the details of an example device according to an aspect of the present invention.

FIG. 8 is a block diagram illustrating the details of an example device in accordance with an aspect of the present invention. Device 800 is shown containing CPU 810, ROM 820, RAM 830, secondary storage 840, graphics controller 870, input interface 880 and network interface 890. Each component is described in further detail below.

CPU 810 executes various instructions retrieved from RAM 830. RAM 830 provides various data and instructions for execution by CPU 810. The data and instruction may be provided from secondary storage 840. CPU 810, RAM 830 and secondary storage 840 may be implemented in a known way.

Graphics controller 870 provides display signals which are eventually displayed on a display unit (not shown). Input interface 880 represents devices such as key-boards which are used by a user to provide input interactively. Network interface 890 is used to send/receive various data packets.

ROM 820 may be implemented using ROM 100 described above. While ROM 100 describes retrieval of a single bit, multiple such units are included in ROM 820 to enable retrieval of a word in a single access. ROM 820 receives an address and provides the word of bits in response.

10. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A memory array comprising:
 a first row of transistors and a second row of transistors being located in adjacent rows;
 a first word line connected to each of said first row of transistors; and
 a second word line connected to each of said second row of transistors,
 wherein a layer forming said first word line is laid on top of a layer forming said second word line in a layout forming said memory array such that said first word line is centered over said second word line.

2. The memory array of claim 1, wherein each of said first row of transistors and said second row of transistors comprises:
 a diffusion layer forming a drain area and a source area;
 a poly-silicon layer forming a gate area for said first row of transistors and said second row of transistors; and
 a metal1 layer forming said first word line.

3. The memory array of claim 2, further comprising a metal2 layer forming said second word line.

4. The memory array of claim 3, further comprising a metal3 layer forming a plurality of bit lines.

5. The memory array of claim 4, further comprising a contact layer to connect said metal1 layer to said poly-silicon layer forming said gate area of said first row of transistors.

6. The memory array of claim 5, further comprising a Via1 layer, wherein said Via1 layer and said contact layer connect said metal2 layer to said poly-silicon layer forming said gate area of said second row of transistors.

7. The memory array of claim 6, further comprising a plurality of metal islands formed by said metal1 layer, said metal2 layer, said metal3 layer, said Via1 layer and said contact layer.

8. The memory array of claim 7, wherein a Via2 layer is used with each of said plurality of metal islands to program a corresponding bit cell to either 0 or 1.

9. The memory array of claim 8, further comprising a power strap formed by said metal1 layer, said metal2 layer, said metal3 layer, said Via1 layer, said Via2 layer, and said contact layer, wherein said contact layer connects Vss to said source area of each of said first row of transistors and said second row of transistors.

10. The memory array of claim 7, wherein a Via1 layer is used with each of said plurality of metal islands to program a corresponding bit cell to either 0 or 1.

11. The memory array of claim 8, further comprising a power strap formed by said metal1 layer, said metal2 layer, said metal3 layer, said Via1 layer, said Via2 layer, and said contact layer, wherein said contact layer connects Vss to said source area of each of said first row of transistors and said second row of transistors.

12. A memory unit comprising:
 a memory array comprising:
  a first row of transistors and a second row of transistors being located in adjacent rows, wherein each of said first row of transistors and said second row of transistors is designed to store a bit value;
  a first word line connected to each of said first row of transistors; and
  a second word line connected to each of said second row of transistors,
  wherein a layer forming said first word line is laid on top of a layer forming said second word line in a layout forming said memory array such that said first word line is centered over said second word line;
 a decoder circuit receiving an address identifying one of said first row of transistors and said second row of transistors, and retrieving said bit value stored in the transistor identified by said address.

13. The memory unit of claim 12, wherein each of said first row of transistors and said second row of transistors comprises:
- a diffusion layer forming a drain area and a source area;
- a poly-silicon layer forming a gate area for said first row of transistors and said second row of transistors; and
- a metal1 layer forming said first word line.

14. The memory unit of claim 13, further comprising a metal2 layer forming said second word line.

15. The memory unit of claim 14, further comprising a metal3 layer forming a plurality of bit lines.

16. The memory unit of claim 15, further comprising a contact layer to connect said metal1 layer to said poly-silicon layer forming said gate area of said first row of transistors.

17. The memory unit of claim 16, further comprising a Via1 layer, wherein said Via1 layer and said contact layer connect said metal2 layer to said poly-silicon layer forming said gate area of said second row of transistors.

18. The memory unit of claim 17, further comprising a plurality of metal islands formed by said metal1 layer, said metal2 layer, said metal3 layer, said Via1 layer and said contact layer.

19. The memory unit of claim 18, wherein a Via2 layer is used with each of said plurality of metal islands to program a corresponding bit cell to either 0 or 1.

20. The memory unit of claim 19, further comprising a power strap formed by said metal1 layer, said metal2 layer, said metal3 layer, said Via1 layer, said Via2 layer, and said contact layer, wherein said contact layer connects Vss to said source area of each of said first row of transistors and said second row of transistors.

21. The memory unit of claim 18, wherein a Via1 layer is used with each of said plurality of metal islands to program a corresponding bit cell to either 0 or 1.

22. The memory unit of claim 19, further comprising a power strap formed by said metal1 layer, said metal2 layer, said metal3 layer, said Via1 layer, said Via2 layer, and said contact layer, wherein said contact layer connects Vss to said source area of each of said first row of transistors and said second row of transistors.

23. The memory unit of claim 22, wherein said memory unit represents a ROM.

* * * * *